US007126229B2

United States Patent
Hsu et al.

(10) Patent No.: US 7,126,229 B2
(45) Date of Patent: Oct. 24, 2006

(54) WIRE-BONDING METHOD AND SEMICONDUCTOR PACKAGE USING THE SAME

(75) Inventors: Chin-Teng Hsu, Taichung (TW); Ming-Chun Laio, Taichung (TW); Holman Chen, Taichung (TW); Chun-Yuan Li, Taichung (TW); Fu-Di Tang, Taichung (TW)

(73) Assignee: Siliconware Precision Industries Co., Ltd.(TW)

( * ) Notice: Subject to any disclaimer, the term of this patent is extended or adjusted under 35 U.S.C. 154(b) by 0 days.

(21) Appl. No.: 10/894,925

(22) Filed: Jul. 19, 2004

(65) Prior Publication Data

US 2005/0173791 A1    Aug. 11, 2005

(30) Foreign Application Priority Data

Feb. 6, 2004  (TW) ............................... 93102738 A

(51) Int. Cl.
*H01L 23/48*  (2006.01)
*H01L 23/52*  (2006.01)
*H01L 23/495*  (2006.01)

(52) U.S. Cl. ..................... 257/784; 257/666
(58) Field of Classification Search .............. 257/784, 257/666

See application file for complete search history.

(56) References Cited

U.S. PATENT DOCUMENTS

| 5,010,010 | A  | * | 4/1991 | Gautvik et al. .......... 435/252.3 |
| 5,910,010 | A  | * | 6/1999 | Nishizawa et al. ........... 438/15 |
| 6,252,305 | B1 | * | 6/2001 | Lin et al. ..................... 257/777 |
| 2004/0041008 | A1 | * | 3/2004 | Mochida .................. 228/180.5 |

* cited by examiner

*Primary Examiner*—Nitin Parekh
(74) *Attorney, Agent, or Firm*—Peter F. Corless; Steven M. Jensen; Edwards Angell Palmer & Dodge LLP

(57) ABSTRACT

A wire-bonding method and a semiconductor package using the same are provided. The semiconductor package includes a carrier; a chip mounted on the carrier; a plurality of first wires and second wires alternatively arranged in a stagger manner, with a wire loop of each second wire being downwardly bent to form a deformed portion so as to provide a height different between the wire loops of each first wire and each second wire, wherein the first and second wires electrically connect the chip to the carrier; and an encapsulant for encapsulating the chip, the first wires, the second wires and a portion of the carrier. The height difference between the wire loops of each first wire and each second wire increases a pitch between adjacent first and second wires thereby preventing the wires from contact and short circuit with each other due to wire sweep during an encapsulation process.

9 Claims, 10 Drawing Sheets

WIRE-BONDING METHOD AND SEMICONDUCTOR PACKAGE USING THE SAME

FIELD OF THE INVENTION

The present invention relates to wire-bonding methods and semiconductor packages using the methods, and more particularly, to a wire-bonding method to form bonding wires having different heights of wire loops of adjacent wires, and a semiconductor package using this wire-bonding method.

BACKGROUND OF THE INVENTION

Conventionally for electrical connection established between a chip and an external component in a semiconductor package by using wire-bonding technology, the quality of electrical connection and the distribution density of bonding wires are key factors to determine the reliability and performances of the semiconductor package. Therefore, it has become an important issue in the semiconductor industries to maintain relatively higher reliability of the bonding wires in wire-bonding and other fabrication processes.

A conventional semiconductor package fabricated using the wire-bonding technology is shown in FIG. 7. In the case of having a lead frame 50 as a chip carrier, a semiconductor chip 53 is mounted on a die pad 51 of the lead frame 50. A plurality of bonding wires 54 are bonded to bond pads 55 on an active surface of the chip 53 and to leads 52 of the lead frame 50, such that the chip 53 is electrically connected to the leads 52 via the bonding wires 54. Further, an encapsulant 56 is formed to encapsulate the chip 53 and the bonding wires 54 to completely fabricate the semiconductor package. According to the steps of the fabrication processes, it is realized that to improve the electrical quality of the bonding wires 54, not only the reliability of the wire-bonding process should be enhanced, but also the following encapsulation process plays an important role in determining the electrical quality of the bonding wires 54 so as not to degrade the bonding wires 54 during injection or filling of the encapsulant 56.

FIG. 8 shows the encapsulation process for the above wire-bonded semiconductor package. The lead frame 50 is placed between an upper mold 60 and a lower mold 61, wherein the chip 53 and the plurality of bonding wires 54 on the lead frame 50 are received in an upper mold cavity 62 formed between the upper mold 60 and the lead frame 50. The upper mold cavity 62 is communicative with a lower mold cavity 63 via gaps between the die pad 51 and the leads 52 and between the adjacent leads 52. A resin for fabricating the encapsulant 65 is injected through a gate 64 located at one side of the upper mold 60 or the lower mold 61, allowing the resin to gradually fill the upper mold cavity 62 and the lower mold cavity 63 and encapsulate the chip 53 and the bonding wires 54. However, referring to a top view of FIG. 9A, the plurality of bonding wires 54 around the chip 53 are arranged in various directions, such that a direction of the resin flow (as indicated by the arrows) would be perpendicular to that of some of the bonding wires 54. These wires 54 are thus subject to impact from the resin flow and incurred with wire sweep as shown in FIG. 9B, and the swept wires 54 may come into contact with adjacent wires 54 thereby causing short circuit and degrading the electrical quality. Particularly, the wire sweep more easily occurs for the longer wires having higher wire loops. Further, in order to improve the functionality and performance of semiconductor devices, the technology has been developed to incorporate more bonding wires and reduce a pitch between adjacent wires in the semiconductor devices. This adversely increases the occurrence of short circuit caused by undesirable contact between the adjacent densely-arranged wires.

In order to eliminate the above drawbacks, U.S. Pat. No. 5,359,227 discloses the use of bonding wires having different heights of wire loops as shown in FIG. 10. The wire loops of adjacent wires 75, 76 are made different in height, such that a pitch between the adjacent wires 75, 76 is increased by a height difference H of the wire loops of the wires 75, 76. This is to prevent the adjacent wires 75, 76 from contact with each other in the case of the wires 75, 76 being swept by the resin flow impact, thereby solving the foregoing electrical problem. However, this arrangement makes the largest loop height S of the wire 75 much greater than the original loop height (S-H) and the thickness of a chip 77, such that the overall package thickness would be undesirably increased, which not complies with the requirement of miniaturization in package size and also leads to increase in the fabrication cost on the mold and the encapsulation process.

Alternatively, U.S. Pat. No. 5,156,323 discloses a wire-bonding method using a capillary of a wire bonder to adjust its moving track to form a wire 85 with a predetermined shape of wire loop as shown in FIG. 11, so as to reinforce rigidity of the wire 85 and reduce the chance of wire sweep caused by the resin flow impact. However, this method only alters the loop shape of the wire 85 but not the pitch between the wire 85 and an adjacent wire. As a result, if the resin flow impact is great enough, the wire 85 would still be swept or shifted to come into contact with the adjacent wire thereby leading to short circuit and decreasing the production yield. Further, U.S. Pat. No. 5,111,989 similarly discloses a wire-bonding method to control the shape of a wire loop, which however encounters the same drawbacks as U.S. Pat. No. 5,156,323 and is not able to solve the foregoing problems.

Therefore, the problem to be solved here is to provide an improved wire-bonding method and a semiconductor package using this method, which can prevent adjacent bonding wires from contact and short circuit with each other due to resin flow impact, as well as provide advantages such as a miniaturized profile, simple fabrication processes and a high yield for the semiconductor package.

SUMMARY OF THE INVENTION

A primary objective of the present invention is to provide a wire-bonding method and a semiconductor package using the same so as to improve the electrical quality of the semiconductor package.

Another objective of the present invention is to provide a wire-bonding method and a semiconductor package using the same by which the fabricated semiconductor package has a miniaturized size.

Still another objective of the present invention is to provide a wire-boding method and a semiconductor package using the same, which can increase a pitch between adjacent bonding wires to prevent the adjacent wires from contact and short circuit with each other.

A further objective of the present invention is to provide a wire-bonding method and a semiconductor package using the same, which can reduce the affection of resin flow impact on bonding wires.

A further objective of the present invention is to provide a wire-bonding method that is easy to implement, and a semiconductor using the same.

In accordance with the above and other objectives, the present invention proposes a semiconductor package comprising: at least one chip having an active surface, wherein a plurality of first bonding points are formed on the active surface of the chip; a carrier having a plurality of conductive members and mounted with the chip thereon, wherein a plurality of second bonding points are formed on the conductive members; a plurality of first wires and a plurality of second wires alternatively arranged with the first wires in a stagger manner, wherein the first wires and the second wires electrically connect the first bonding points of the chip to the second bonding points on the conductive members of the carrier, and wire loops of the second wires are each downwardly deformed to form a deformed portion so as to provide a height difference between the wire loop of each of the second wires and that of each of the first wires; and an encapsulant for encapsulating the chip, the first wires, the second wires and a portion of the carrier.

A wire-bonding method for fabricating a second wire proposed in the present invention is suitable for a carrier having a plurality of conductive members on which at least one second bonding point is formed, wherein the carrier is mounted thereon with at least one chip having an active surface on which at least one first bonding point is formed. The wire-bonding method comprises steps of: using a wire-bonding means to connect one end of a second wire to the first bonding point of the chip; moving the wire-bonding means upwardly from the first bonding point by a predetermined distance and horizontally shifting the wire-bonding means in a direction away from the second bonding point by a first distance so as to generate a first wire bend; then moving the wire-bonding means upwardly by a predetermined distance and horizontally shifting the wire-bonding means in a direction towards the second bonding point by a second distance so as to generate a second wire bend, wherein the second distance is larger than the first distance; further moving the wire-bonding means upwardly by a predetermined distance; and moving the wire-bonding means to the second bonding point and cutting the second wire using the wire-bonding means to connect the cutting end of the second wire to the second bonding point, such that the second wire is bonded to the first bonding point of the chip and the second bonding point on the carrier respectively, and a wire loop of the second wire is formed with a deformed portion corresponding to the second wire bend.

The deformed portion of the wire loop of the second wire is lower in height than the wire loop of the first wire and the active surface of the chip. The second wire may serve as a signal wire or a ground wire depending on different circuit designs. Moreover, the wire-bonding means is a capillary of a conventional wire bonder.

The carrier can be a lead frame or a substrate. If the carrier is a lead frame, the conductive members are a plurality of leads of the lead frame, such that the second wire serving as a signal wire is connected to a lead, whereas the second wire serving as a ground wire is connected to a die pad of the lead frame. Further, if the carrier is a substrate, the conductive members are a plurality of conductive traces formed on the substrate.

Therefore, the wire-bonding method and the semiconductor package using the same proposed in the present invention, by provision of the second wires, have significant benefits as to preventing adjacent wires from contact and short circuit with each other due to wire sweep caused by the resin flow impact, as well as achieving profile miniaturization, simple fabrication processes and a high yield, such that the drawbacks in the prior art are eliminated.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE PREFERRED EMBODIMENTS

The following description exemplifies a semiconductor package using a lead frame as a carrier to illustrate a preferred embodiment of a wire-bonding method proposed in the present invention by which the fabricated wires are used to electrically connect a chip and a plurality of leads of the lead frame, with reference to in FIGS. 1A to 1F.

Figure 1A:
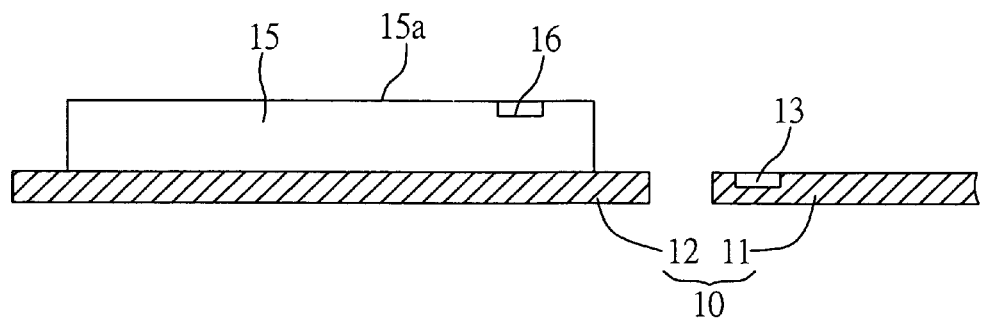
FIGS. 1A to 1F are schematic diagrams showing procedural steps of a wire-bonding method according to a preferred embodiments of the present invention by which second wires are formed.
Figure 1B:
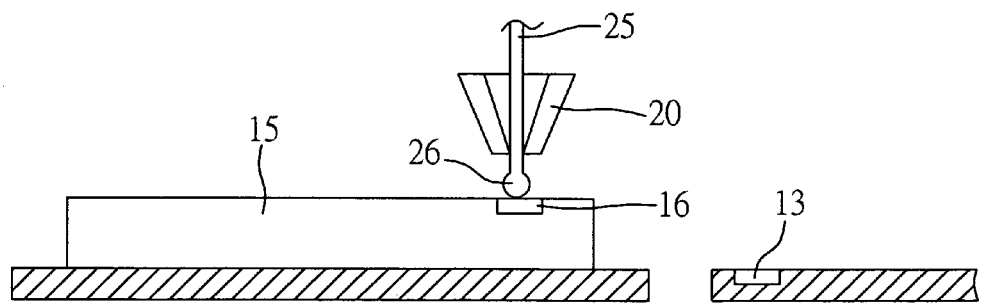
Figure 1C:
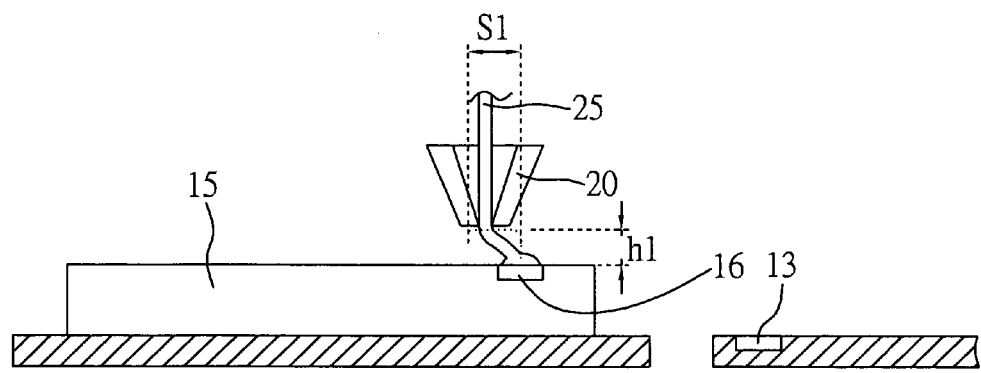
Figure 1D:
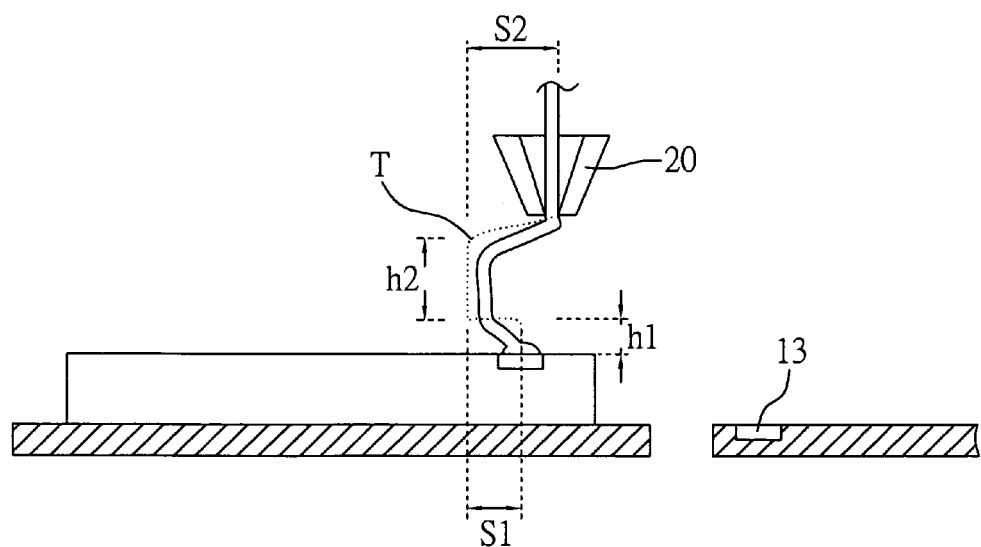
Figure 1E:
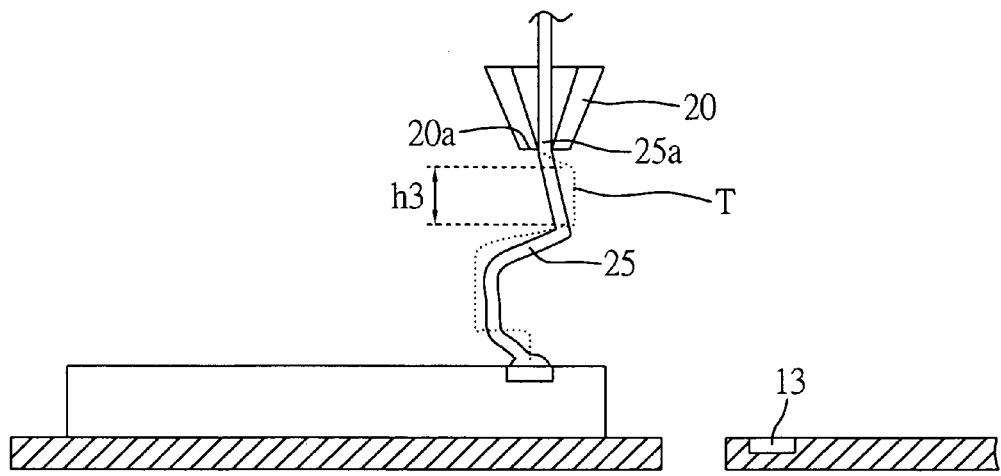
Figure 1F:
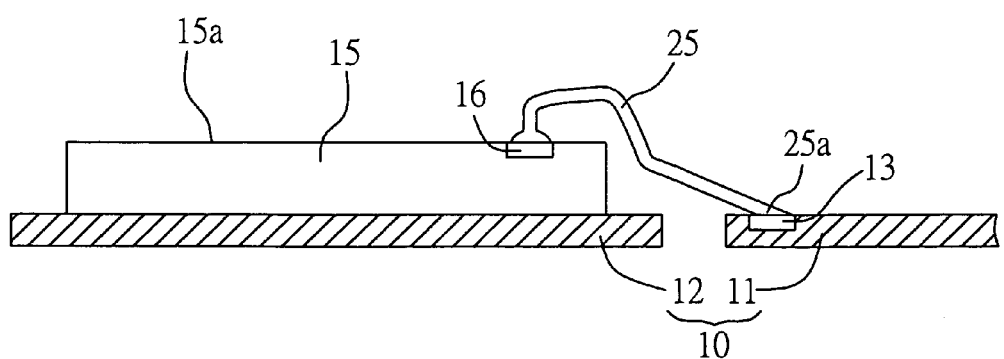

First, referring to FIG. 1A, the lead frame 10 having a die pad 12 mounted with the chip 15 thereon is prepared. The plurality of leads 11 of the lead frame 10 and an active surface 15a of the chip 15 are formed with a plurality of second bonding points 13 and first bonding points 16, respectively. Referring to FIG. 1B, a wire bonder is used to perform the wire-bonding method, by which a wire 25 such as gold wire is placed in a thermal tolerant capillary 20 of the wire bonder. A FAB (free air ball) 26 is formed on an end of the wire 25 by a spark discharge technique and is pressed onto one of the first bonding points 16 on the chip 15 making the FAB 26 deformed. The FAB 26 is then bonded to the first bonding point 16 by an ultrasonic welding technique. Referring to FIG. 1C, the capillary 20 is raised upwardly to extend and deform the FAB 26 and performs a wire-releasing process. After the capillary 20 is moved upwardly by a predetermined distance h1, it is horizontally shifted in a direction away from the second bonding point 13 on one corresponding lead 11 by a first distance S1 so as to generate a first vertical bend in a moving track of the wire 25, this moving track shown by a dotted line T in FIG. 1D. Further referring to FIG. 1D, the capillary 20 is then moved upwardly by a predetermined distance h2 (h2 can be slightly larger than h1) and horizontally shifted by a second distance S2 in a direction towards the second bonding point 13 and opposite to the first vertical bend so as to generate a second vertical bend of the wire 25, wherein the second distance S2 is larger than the first distance S1. Referring to FIG. 1E, the capillary 20 is further moved upwardly by a predetermined distance h3 that is determined according to a distance between the drawn wire 25 and the second bonding point 13 in a manner as to allow a wire region 25a located at the opening of the capillary 20 to be able to be bonded to the second bonding point 13. Further, in order to facilitate the wire region 25a to be more easily pressed onto the second bonding point 13, the capillary 20 may be horizontally shifted in a direction away from the second bonding point 13 by an appropriate distance as shown by the dotted-line track T, to thereby control the wire-loop shape of the wire 25. Finally, referring to FIG. 1F, the capillary 20 is moved to the second bonding point 13 and the wire region 25a located at the opening of the capillary 20 is subjected to a pressing-bonding process by which the wire region 25a is pressed and bonded onto the second bonding point 13, and an unreleased wire portion within the capillary 20 is cut from the wire region 25a bonded to the second bonding point 13 by using a flat end 20a (shown in FIG. 1E) located around the opening of the capillary 20. As a result, the wire region 25a of the wire 25 is bonded and fixed in position to the second bonding point 13, such that the wire 25 is respectively coupled to the first bonding point 16 and the second bonding point 13 to thereby electrically connect the chip 15 to the lead 11. Therefore, the wire 25 is formed with a downwardly bent wire loop having a deformed portion that is lower in elevation than the active surface 15a of the chip 15 through the use of the wire-bonding method in the present invention, which can solve the prior-art problems caused by the conventional wire-bonding method and encountered for the conventionally fabricated wires.

Figure 2A:
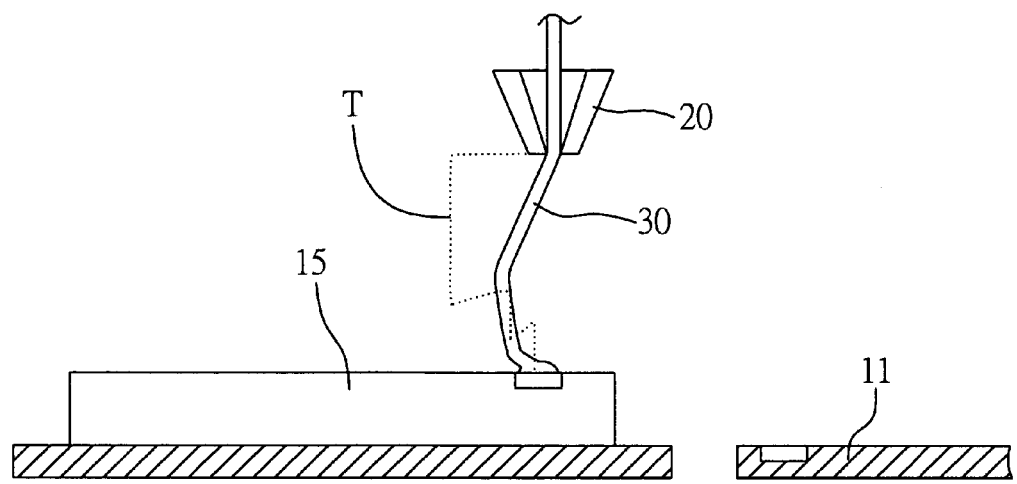
FIGS. 2A and 2B are schematic diagrams showing procedural steps of a currently available wire-bonding method to form first wires.
Figure 2B:
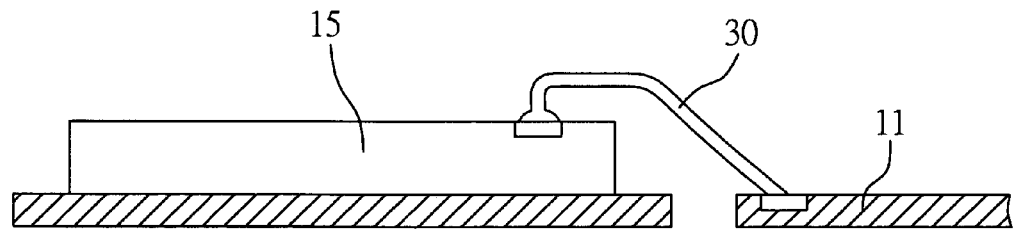

Therefore, the wire 25 formed by the above wire-bonding method in the present invention can be incorporated in a single semiconductor package together with a bonding wire 30 fabricated by the currently available wire-bonding process, so as to solve the electrical problem in the prior art. The wire 30 can be fabricated by the wire-bonding process shown in FIGS. 2A and 2B. Referring to FIG. 2A, the capillary 20 of the wire bonder is operated to draw wire along a track T indicated by the dotted line, by which the capillary 20 is moved upwardly and horizontally shifted twice in a direction away from one corresponding lead 11. Then a longer portion of the wire 30 is drawn out and connected to the corresponding lead 11, as shown in FIG. 2B. Unlike the above wire 25, a wire loop of this wire 30 is not bent downwardly to have a deformed portion and is thus higher in elevation than that of the wire 25 according to the present invention, so as to provide a height difference between the wire loops of the wire 30 and the downwardly-bent wire 25 (comparing FIG. 1F with FIG. 2B). The wire 30 fabricated by the currently available wire-bonding process is customarily referred to as "first wire 30", and the wire 25 fabricated by the wire-bonding process proposed in the present invention is customarily referred to as "second wire 25" hereinafter.

Figure 3:
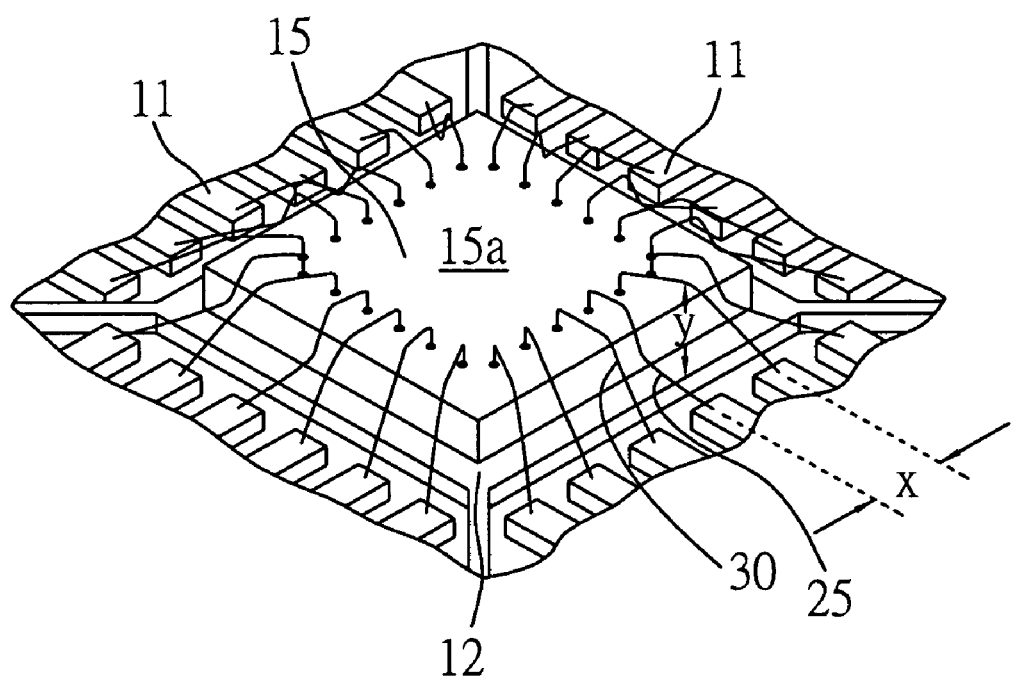
FIG. 3 is a schematic diagram showing a stagger arrangement of the first wires and the second wires around a chip according to the present invention.
Figure 4A:
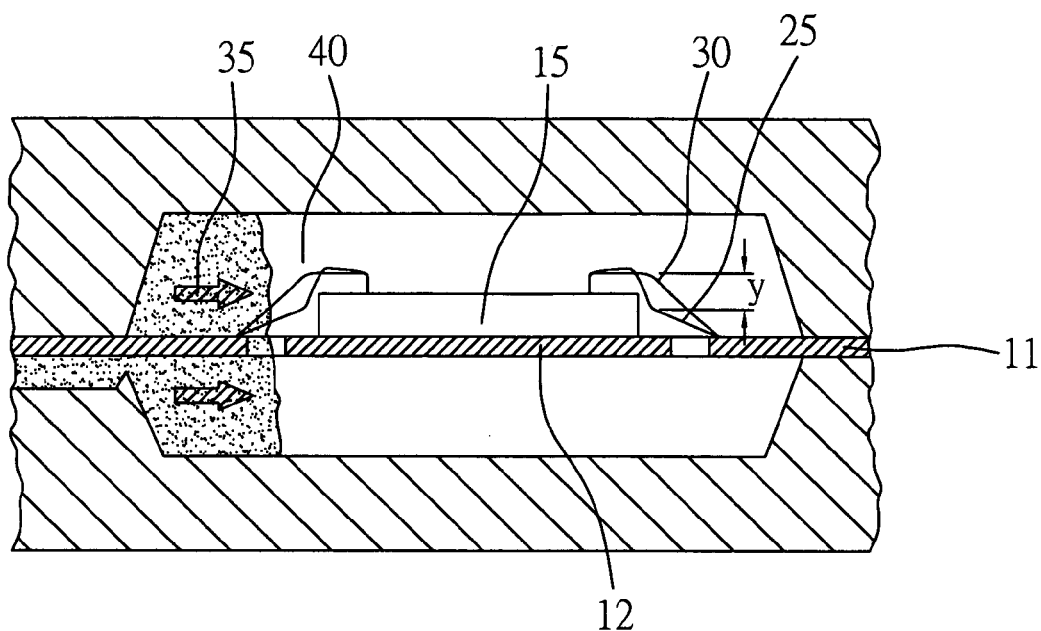
FIGS. 4A and 4B are schematic diagrams showing procedural steps of an encapsulation process for the chip and the wires shown in FIG. 3.
Figure 4B:
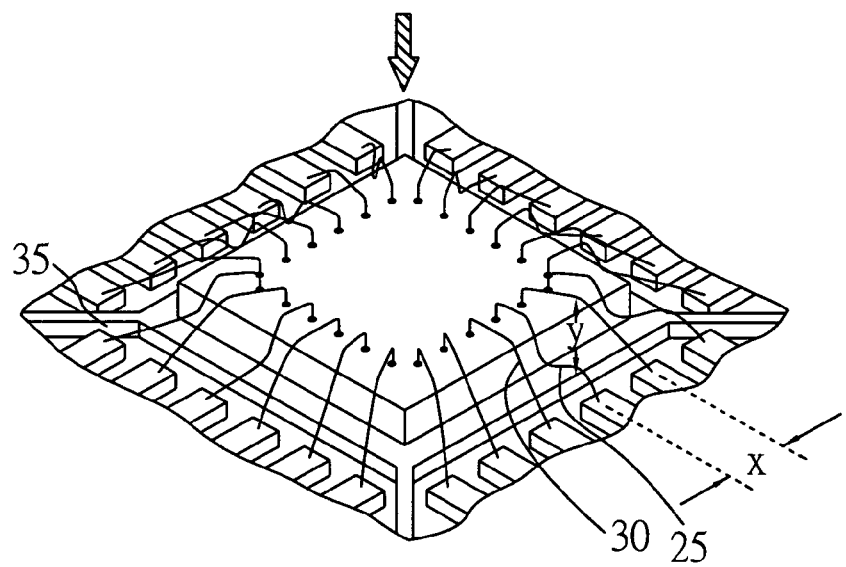

First wires 30 and second wires 25 can be both incorporated in a single package. As shown in FIG. 3, the first wires 30 and the second wires 25 are alternatively arranged around the chip 15 in a stagger manner that each of the first wires 30 is adjacent to each of the second wires 25. The first wires 30 and the second wires 25 serve as signal wires for electrically connecting the active surface 15a of the chip 15 to the leads 11 and transmitting signals. Since the wire loops of the first wire 30 and the second wire 25 have different heights and shapes, besides a horizontal distance X between the two adjacent wires 30, 25, a pitch between a pair of the adjacent first and second wires 30, 25 is increased by a vertical distance Y corresponding to the height difference between the wire loops of the first and second wires 30, 25. During an encapsulation process shown in FIGS. 4A and 4B, the increased pitch between the adjacent wires 30, 25 prevents undesirable contact and short circuit between adjacent wires due to wire sweep. Even if those wires perpendicular to a flow direction 35 of a resin for making an encapsulant 40, which is to encapsulate the chip 15 and wires 25, 30, are swept by the resin flow impact, the presence of the vertical distance or height difference Y between adjacent wires prevents the swept wires from contact with the wires adjacent thereto. In such a case, no matter how densely packed the wires in the package are and how small the horizontal distance X between adjacent wires is, the undesirable contact between the wires swept by the resin flow impact can be avoided, thereby eliminating the prior-art drawbacks caused by the conventional wire-bonding technique.

Further since the wire loop of the first wire 30 is lower in height than the traditional wiring method and the second wire 25 is lower in height than that of the first wire 30 and even the deformed portion of the wire loop of the second wire 25 is lower in elevation than the active surface 15a of the chip 15, the encapsulated package desirably has a reduced thickness and miniaturized size. Moreover, the wire-bonding method proposed in the present invention also advantageously has simple fabrication processes and a low cost, which is accomplished by simply altering an automatically operating path of the wire bonder to control the capillary to move along a predetermined track. This thereby eliminates the prior-art drawbacks and is feasible for commercial mass production.

In addition to the above signal wires, the second wires 25 can also serve as ground wires in the package to electrically connect the active surface 15a of the chip 15 to the die pad 12 of the lead frame 10 and provide the chip 15 with a grounding effect. The ground wires can be prevented from contact and short circuit with adjacent signal wires due to wire sweep, thereby assuring the electrical quality of the grounding effect.

Figure 5:
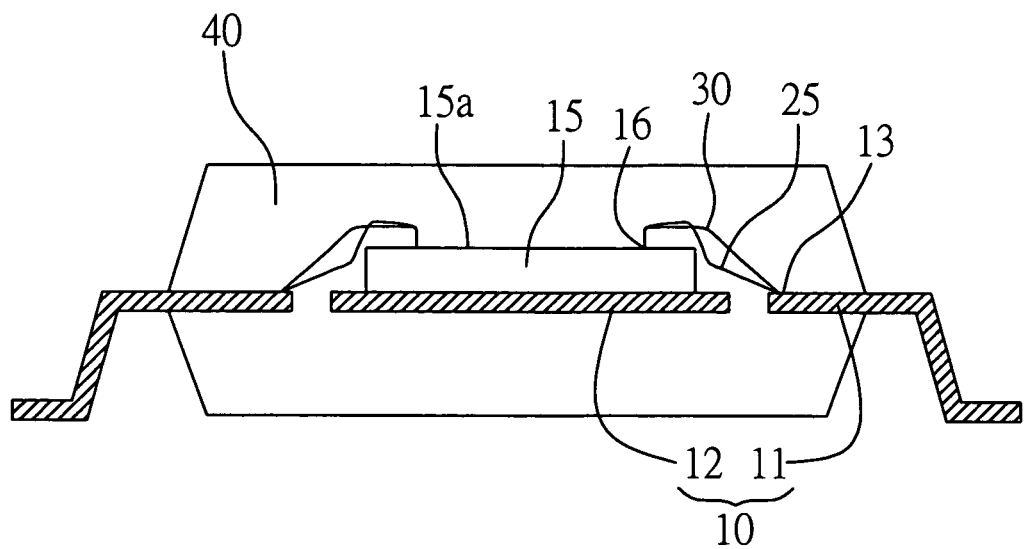
FIG. 5 is a cross-sectional view of a semiconductor package according to a preferred embodiment of the present invention.

As shown in FIG. 5, the semiconductor package fabricated using the wire-bonding method proposed in the present invention comprises a lead frame 10 having a die pad 12 and a plurality of leads 11 around the die pad 12, wherein a plurality of second bonding points 13 are formed on the leads 11; a chip 15 mounted on the die pad 12, with a plurality of first bonding points 16 formed on an active surface 15a of the chip 15; and a plurality of wires for electrically connecting the first bonding points 16 of the chip 15 to the second bonding points 13 on the leads 11, the plurality of wires comprising a set of first wires 30 fabricated by the currently available wire-bonding method and a set of second wires 25 formed by the wire-bonding method proposed in the present invention, wherein the first wires 30 and the second wires 25 are alternatively arranged in a stagger manner, and wire loops of the second wires 25 are each bent downwardly to form a deformed portion so as to provide a height difference between the wire loops of the second wires 25 and the first wires 30. The semiconductor package further comprises an encapsulant 40 for encapsulating the die pad 12, the chip 15, the first wires 30, the second wires 25, and an inner portion of the leads 11, allowing an outer portion of the leads 11 to be exposed from the encapsulant 40 and bent in shape for transmitting signals and providing electrical connection between the chip 15 and external devices.

Figure 6:
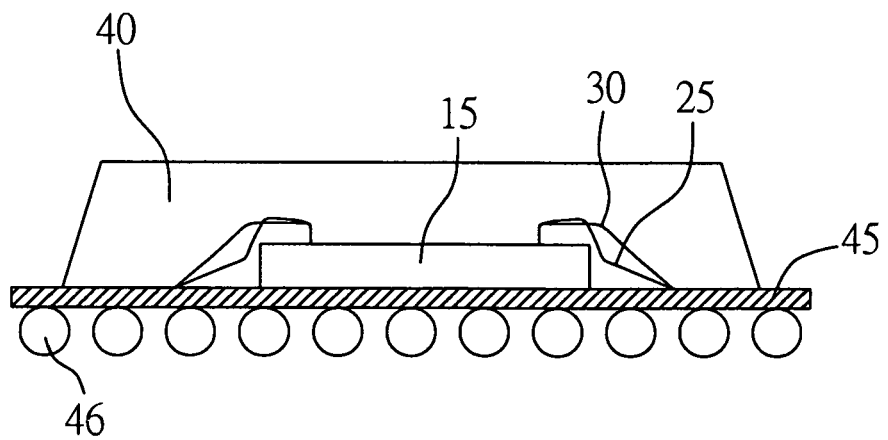
FIG. 6 is a cross-sectional view of a semiconductor package according to another preferred embodiment of the present invention.
Figure 7:
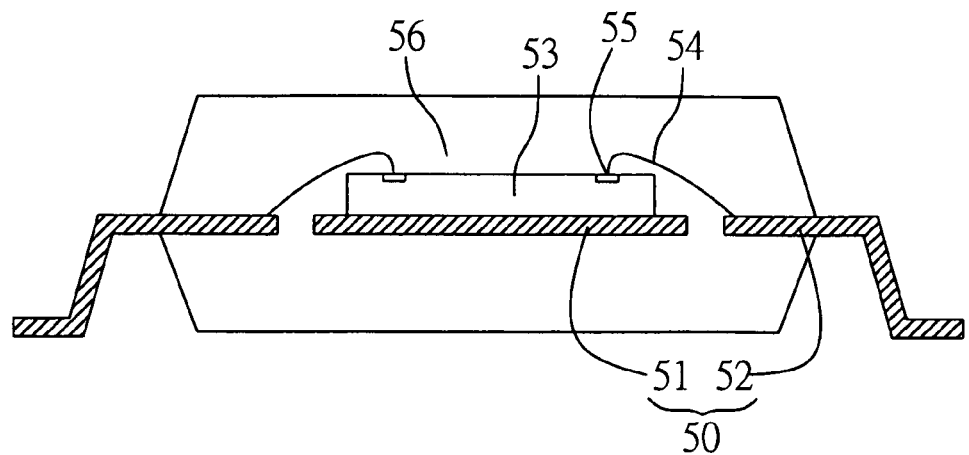
FIG. 7 (PRIOR ART) is a cross-sectional view of a conventional semiconductor package using a lead frame as a chip carrier.
Figure 8:
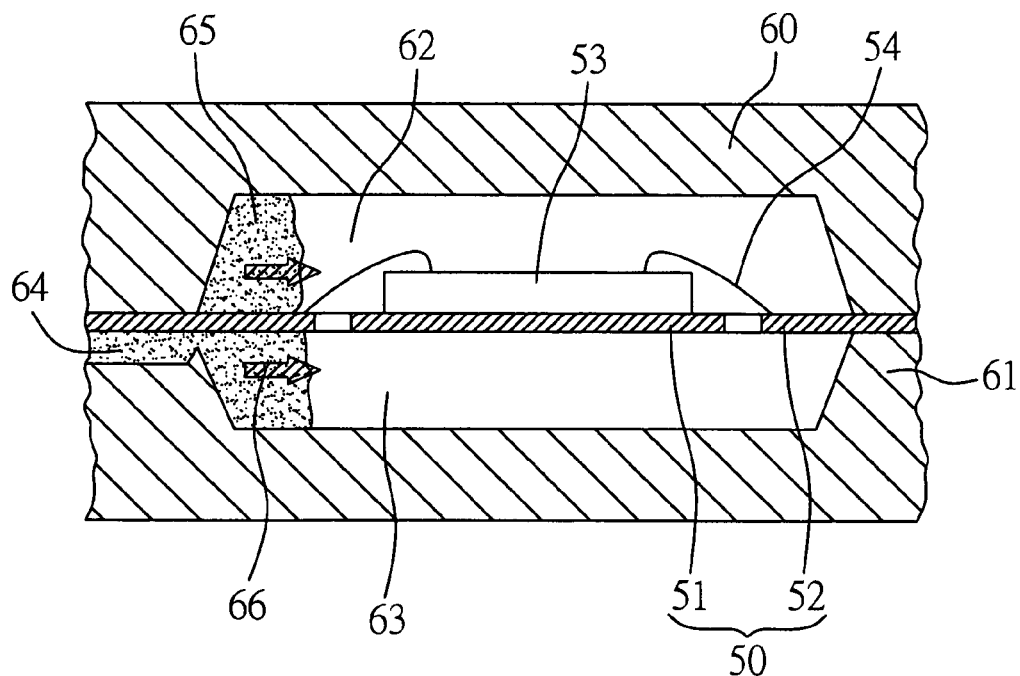
FIG. 8 (PRIOR ART) is a cross-sectional view showing an encapsulation process for the semiconductor package shown in FIG. 7.
Figure 9A:
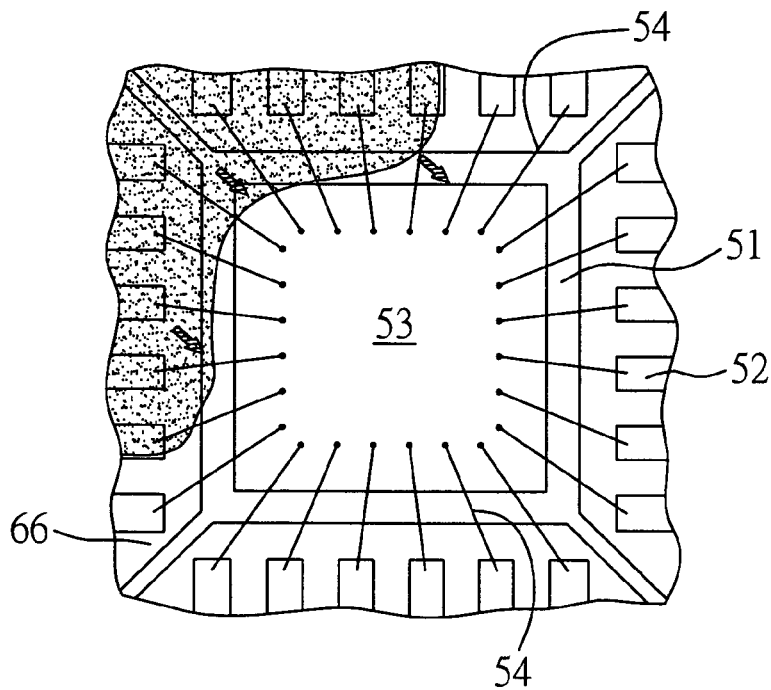
FIG. 9A (PRIOR ART) is a top view showing the encapsulation process for the semiconductor package shown in FIG. 7.
Figure 9B:
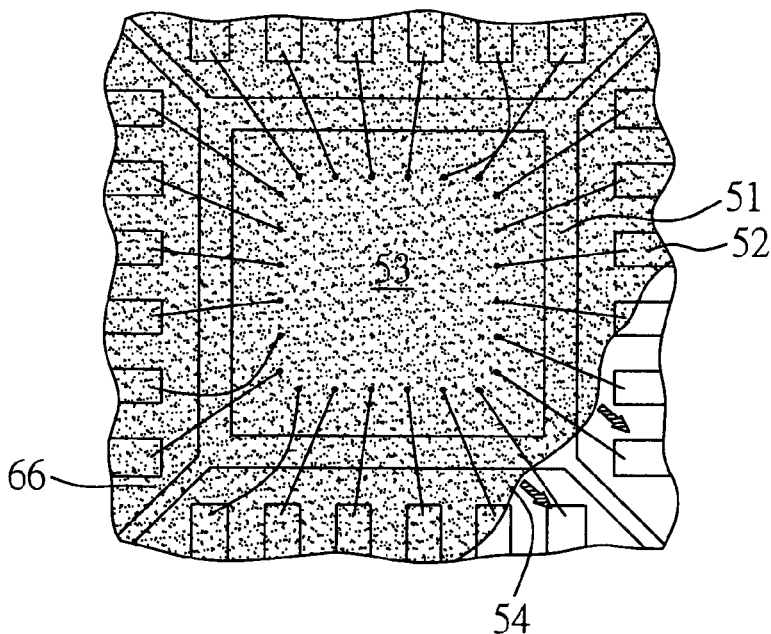
FIG. 9B (PRIOR ART) is a top view showing wire sweep during the encapsulation process for the semiconductor package shown in FIG. 7.
Figure 10:
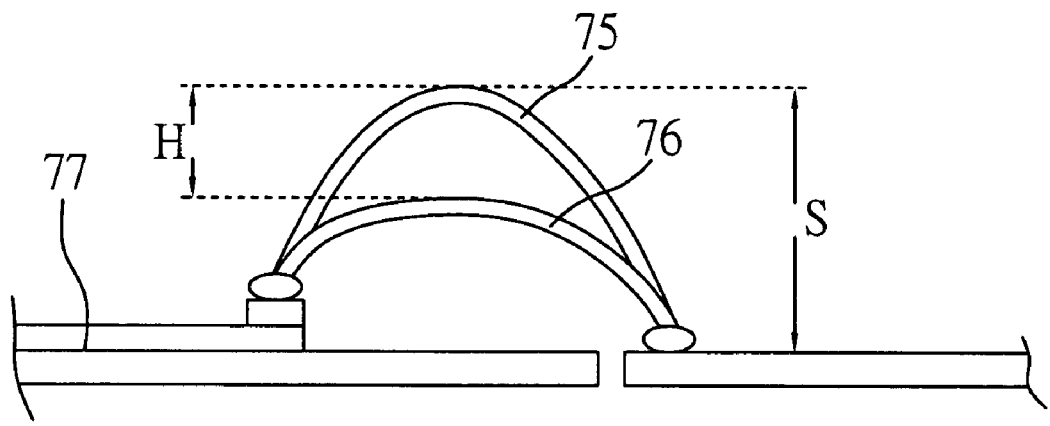
FIG. 10 (PRIOR ART) is a cross-sectional view of a semiconductor package disclosed in U.S. Pat. No. 5,359, 227.
Figure 11:
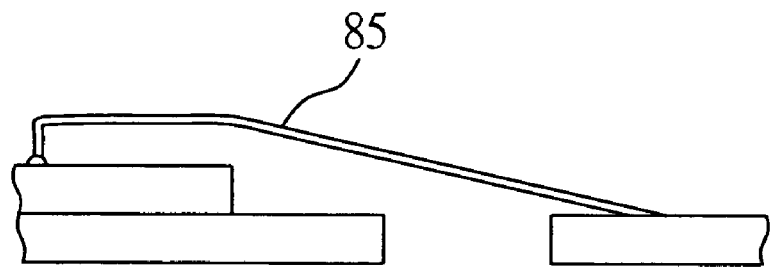
FIG. 11 (PRIOR ART) is a cross-sectional view of a semiconductor package disclosed in U.S. Pat. No. 5,156, 323.

The above embodiments and associated drawings exemplify a package having a lead frame 10 as a carrier. However, it should be understood that the wire-bonding method proposed in the present invention is also suitable for other wire-bonded packages not using the lead frame. Referring to FIG. 6, a ball grid array (BGA) semiconductor package having a substrate 45 as the carrier is readily subject to the wire-bonding method in the present invention. Similarly, first wires 30 and second wires 25 are alternatively arranged around the chip 15 mounted on the substrate 45 so as to electrically connect the active surface 15a of the chip 15 to conductive traces (not shown) formed on the substrate 45. As a result, signals generated from the chip 15 can be transmitted through the conductive traces and a plurality of solder balls 46 located implanted at the bottom of the substrate 45 to the outside. Alternatively, the second wires 25 can be used as ground wires to provide the grounding effect. By virtue of a height difference between the wire loops of adjacent first and second wires 30, 25, the pitch between adjacent wires is increased, and undesirable contact and short circuit between adjacent wires caused by wire sweep can be prevented during the subsequent encapsulation process for forming the encapsulant 40, thereby eliminating the drawbacks in the prior art.

Therefore, the wire-bonding method and the semiconductor package using the same proposed in the present invention have significant benefits as to preventing adjacent wires from contact and short circuit with each other due to wire sweep caused by the resin flow impact, as well as achieving profile miniaturization, simple fabrication processes and a high yield, which are greatly favor for the development of the packaging technology.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A semiconductor package, comprising:
at least one chip having an active surface, wherein a plurality of first bonding points are formed on the active surface of the chip;
a carrier having a plurality of conductive members and mounted with the chip thereon, wherein a plurality of second bonding points are formed on the conductive members;
a plurality of first wires and a plurality of second wires alternatively arranged with the first wires in a staggered manner, wherein the first wires and the second wires electrically connect the first bonding points of the chip to the second bonding points on the conductive members of the carrier, and wire loops of the second wires are each downwardly deformed to form a deformed portion being lower in height than the active surface of the chip so as to provide a height difference between the wire loop of each of the second wires and that of each of the first wires; and
an encapsulant for encapsulating the chip, the first wires, the second wires and a portion of the carrier.

2. The semiconductor package of claim 1, wherein the deformed portion of the wire loop of each of the second wires is lower in height than the wire loop of each of the first wires.

3. The semiconductor package of claim 1, wherein the first wires and the second wires are gold wires.

4. The semiconductor package of claim 1, wherein the first wires and the second wires are signal wires.

5. The semiconductor package of claim 1, wherein the second wires are ground wires.

6. The semiconductor package of claim 1, wherein the carrier is a lead frame.

7. The semiconductor package of claim 6, wherein the conductive members are leads of the lead frame.

8. The semiconductor package of claim 1, wherein the carrier is a substrate.

9. The semiconductor package of claim 8, wherein the conductive members are conductive traces formed on the substrate.

* * * * *